US008547521B1

(12) United States Patent
Dakshina-Murthy et al.

(10) Patent No.: US 8,547,521 B1
(45) Date of Patent: Oct. 1, 2013

(54) SYSTEMS AND METHODS THAT CONTROL LIQUID TEMPERATURE IN IMMERSION LITHOGRAPHY TO MAINTAIN TEMPERATURE GRADIENT TO REDUCE TURBULENCE

(75) Inventors: Srikanteswara Dakshina-Murthy, Wappingers Falls, NY (US); Bhanwar Singh, Morgan Hill, CA (US); Ramkumar Subramanian, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 2175 days.

(21) Appl. No.: 11/000,653

(22) Filed: Dec. 1, 2004

(51) Int. Cl.
*G03B 27/42* (2006.01)
*G03B 27/52* (2006.01)
*G03B 27/54* (2006.01)

(52) U.S. Cl.
USPC ............... 355/53; 355/30; 355/67; 438/5

(58) Field of Classification Search
USPC ............... 340/870.17; 438/5; 355/30, 53, 355/67; 62/259.2
See application file for complete search history.

(56) References Cited

U.S. PATENT DOCUMENTS

| 5,191,791 | A | * | 3/1993 | Gerardi et al. ............... 73/178 R |
| 5,265,957 | A | * | 11/1993 | Moslehi et al. .................... 374/1 |
| 5,969,639 | A | * | 10/1999 | Lauf et al. ................. 340/870.17 |
| 6,738,722 | B2 | * | 5/2004 | Polla et al. ..................... 702/104 |
| 6,844,206 | B1 | * | 1/2005 | Phan et al. ......................... 438/7 |
| 6,867,844 | B2 | * | 3/2005 | Vogel et al. ..................... 355/30 |
| 7,006,209 | B2 | * | 2/2006 | Levinson ...................... 356/128 |
| 2004/0257544 | A1 | * | 12/2004 | Vogel et al. ..................... 355/30 |

* cited by examiner

Primary Examiner — John Pettitt
(74) Attorney, Agent, or Firm — Turocy & Watson, LLP

(57) ABSTRACT

The subject invention provides systems and methods that monitor and/or control turbulence of an immersion medium. The systems and methods relate to computer controlled techniques that reduce effects of immersion medium flow due to a liquid temperature gradient. According to an aspect of the subject invention, a number of temperature measurements of the immersion medium are obtained, and the temperature measurements are utilized to generate a gradient map of the immersion medium. By way of illustration, the temperature measurements can be made via wireless temperature sensors. The gradient map can be utilized to understand the stability of the immersion medium. According to an aspect of the subject invention, instability identified with the gradient map can be mitigated.

21 Claims, 9 Drawing Sheets

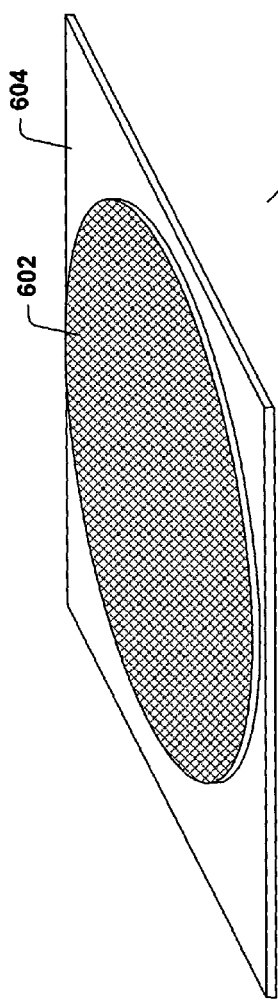
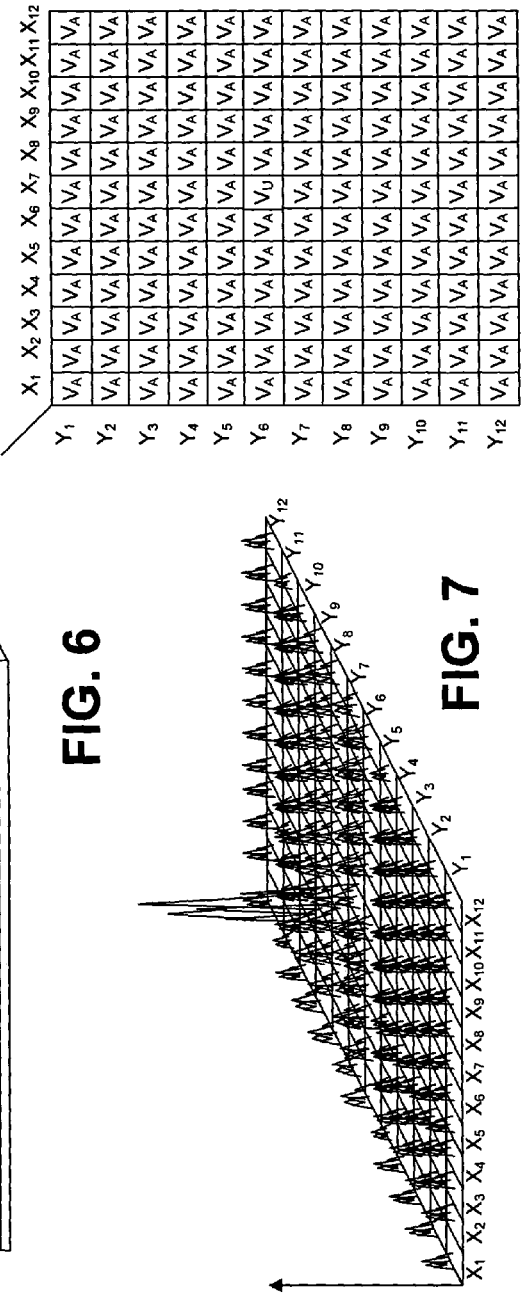
FIG. 6
FIG. 7
FIG. 8 ns # US 8,547,521 B1

SYSTEMS AND METHODS THAT CONTROL LIQUID TEMPERATURE IN IMMERSION LITHOGRAPHY TO MAINTAIN TEMPERATURE GRADIENT TO REDUCE TURBULENCE

TECHNICAL FIELD

The subject invention generally relates to semiconductor processing and, more particularly, to systems and methods for monitoring and/or controlling a temperature gradient of an immersion medium utilized in connection with immersion lithography to reduce turbulence.

BACKGROUND OF THE INVENTION

In the semiconductor industry, there is a continuing trend toward higher device densities. To achieve these higher device densities there have been, and continue to be, efforts toward scaling down device dimensions (e.g., at sub-micron levels) on semiconductor wafers. In order to accomplish such densities, smaller feature sizes and more precise feature shapes are required. This can include width and spacing of interconnecting lines, spacing and diameter of contact holes, and surface geometry, such as corners and edges, of various features. The dimensions of and between such small features can be referred to as critical dimensions (CDs). Reducing CDs and reproducing more accurate CDs facilitates achieving higher device densities.

High resolution lithographic processes can be used to achieve small features. In general, lithography refers to processes for pattern transfer between various media. In lithography for integrated circuit fabrication, a silicon slice, the wafer, is coated uniformly with a radiation-sensitive film, the photoresist. The film is selectively exposed with radiation (e.g., optical light, x-ray, electron beam, . . . ) through an intervening master template (e.g., mask, reticle, . . . ) forming a particular pattern (e.g., patterned resist). Dependent upon coating type, exposed areas of the coating become either more or less soluble than unexposed areas in a particular solvent developer. More soluble areas are removed with the developer in a developing step, while less soluble areas remain on the silicon wafer to form a patterned coating. The pattern corresponds to either the image of the mask or its negative. The patterned resist is used in further processing of the silicon wafer.

Efforts to reduce CDs have included implementing various techniques in connection with the lithographic process, such as reducing exposure radiation wavelength (e.g., from 436 nm mercury g-line to 365 nm i-line to 248 nm DUV to 193 nm excimer laser), improving optical design, utilizing metrology techniques (e.g., scatterometry, scanning electron microscope (SEM)), etc. Immersion lithography is another technique that facilitates further reduction of CDs.

In immersion lithography, a gap between a substrate (e.g., wafer) and a final optical component (e.g., lens, scanner, stepper, . . . ) is filled with an immersion medium, which has a refractive index greater than the refractive index of air. Refractive index is defined as a ratio of speed of light in a vacuum to speed of light in a particular medium. Utilizing an immersion medium with a refractive index greater than that of air, which approximately equals 1, can increase numerical aperture, which is defined as a lens's ability to gather diffracted light and resolve fine details onto a wafer. Furthermore, utilization of an immersion medium can decrease an effective wavelength of an exposure radiation propagating within the immersion medium without changing exposure radiation, lasers, lens materials, etc.

Differences in temperature can be present within the immersion medium. Such temperature variations between different portions of the immersion medium can cause flowing of the immersion medium (e.g., via convection) between regions with disparate temperatures and thus, yield turbulence within the immersion medium. Turbulence can create bubbles in the immersion medium, change pressure of the immersion medium, etc., which can impact optical characteristics of the immersion medium (e.g., refractive index, photolithographic constant), vary an effective wavelength of exposure radiation propagating through the immersion medium employed in connection with immersion lithography, or reflect and/or deflect and/or refract the exposure radiation. Thus, turbulence associated with the immersion medium can impact efficiency of immersion lithography systems and can elevate the costs associated with immersion lithographic processes. Thus, there is a need for systems and methods that improve immersion lithography.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its purpose is merely to present some concepts of the invention in a simplified form as a prelude to the more detailed description that is presented later.

The subject invention provides systems and methods that monitor and/or control turbulence of an immersion medium. The systems and methods relate to computer controlled techniques that reduce effects of immersion medium flow due to a liquid temperature gradient. According to an aspect of the subject invention, a number of temperature measurements of the immersion medium are obtained, and the temperature measurements are utilized to generate a gradient map of the immersion medium. By way of illustration, the temperature measurements can be made via wireless temperature sensors. The gradient map can be utilized to understand the stability of the immersion medium. According to an aspect of the subject invention, instability identified with the gradient map can be mitigated.

According to an aspect of the subject invention, provided is a system that reduces immersion medium turbulence for semiconductor fabrication. The system includes an input component that receives temperature information associated with an immersion medium and a stabilizing component that analyzes the temperature information to identify instability associated with the immersion medium. The input component can be a wireless temperature sensor, for example. The stabilizing component can generate a gradient that describes the conditions of the immersion medium. The stabilizing component can utilize the gradient to control the conditions of the immersion medium. For example, the conditions can be controlled by providing a control signal to another component (e.g., heating component, cooling component, drain, valve, pump, degassing component, . . . ).

According to an aspect of the subject invention, provided is a system that monitors and controls immersion medium turbulence for semiconductor fabrication. The system includes a plurality of immersion medium temperature sensors that measure a temperature associated with a respective location of the immersion medium. Additionally, a first component that generates a gradient map by utilizing the temperatures obtained via the immersion medium temperature sensors and a second component that controls the immersion medium to minimize instability upon identifying turbulence by evaluating the gradient map can be provided.

According to an aspect of the present invention, a method for monitoring and controlling immersion medium stability for semiconductor fabrication is provided. The method includes measuring a temperature of the immersion medium at a plurality of locations, generating a temperature gradient via utilizing the measured temperatures, and identifying turbulence of the immersion medium by analyzing the temperature gradient.

To the accomplishment of the foregoing and related ends, certain illustrative aspects of the invention are described herein in connection with the following description and the annexed drawings. These aspects are indicative, however, of but a few of the various ways in which the principles of the invention may be employed and the subject invention is intended to include all such aspects and their equivalents. Other advantages and novel features of the invention will become apparent from the following detailed description of the invention when considered in conjunction with the drawings.

BRIEF DESCRIPTION OF THE DRAWINGS

FIG. 6 illustrates a perspective view of a grid-mapped wafer corresponding to portions of an immersion medium according to one or more aspects of the subject invention.

FIG. 7 illustrates plots of measurements taken at grid-mapped locations of the immersion medium in accordance with one or more aspects of the subject invention.

FIG. 8 illustrates a table containing entries corresponding to measurements taken at respective grid-mapped locations of the immersion medium in accordance with one or more aspects of the subject invention.

DETAILED DESCRIPTION OF THE INVENTION

Figure 1:
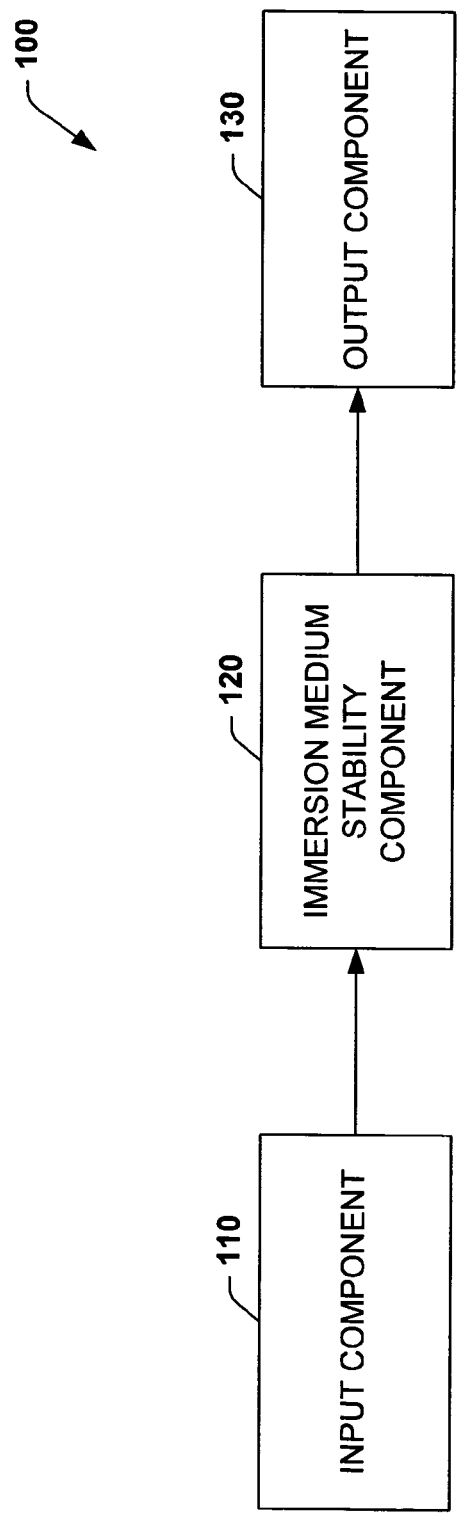
FIG. 1 is an illustration of a system that monitors and/or controls stability of an immersion medium in accordance with an aspect of the subject invention.

The subject invention is now described with reference to the drawings, wherein like reference numerals are used to refer to like elements throughout. In the following description, for purposes of explanation, numerous specific details are set forth in order to provide a thorough understanding of the subject invention. It may be evident, however, to one skilled in the art that one or more aspects of the subject invention may be practiced with a lesser degree of these specific details. In other instances, known structures and devices may be shown in block diagram form in order to facilitate describing one or more aspects of the subject invention.

As used in this application, the term "component" is intended to refer to a computer-related entity, either hardware, a combination of hardware and software, software, or software in execution. For example, a component may be, but is not limited to being a process running on a processor, a processor, an object, an executable, a thread of execution, a program, a set of co-operating computers and/or processes and a computer.

It is to be appreciated that various aspects of the subject invention can employ technologies associated with facilitating unconstrained optimization and/or minimization of error costs. Thus, non-linear training systems/methodologies (e.g., back propagation, Bayesian, fuzzy sets, non-linear regression, or other neural networking paradigms including mixture of experts, cerebella model arithmetic computer (CMACS), radial basis functions, directed search networks, and function line networks) can be employed. The invention can employ various inference schemes and/or techniques in connection with state determination, inference and/or prediction.

As used herein, the term "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines . . . ) can be employed in connection with performing automatic and/or inferred action in connection with the subject invention.

FIG. 1 illustrates a system 100 that monitors and/or controls stability of an immersion medium in accordance with an aspect of the subject invention. The system 100 comprises an input component 110 that receives information associated with an immersion medium, an immersion medium stabilizing component 120 that utilizes the information obtained by the input component 110 to monitor and/or control the stability of the immersion medium, and an output component 130. The input component 110 can be any device capable of obtaining information associated with the immersion medium. For example, the input component 110 can be a sensor that measures a property associated with the immersion medium and/or a portion of the immersion medium. The measured property can be, for example, temperature, pressure, liquid current flow, density, etc. Alternatively and/or additionally, the input component 110 can be a bus, wiring, wireless transmission medium, etc. that provides information related to the immersion medium to the immersion medium stabilizing component 120.

The immersion medium stabilizing component 120 monitors and/or controls the stability of the immersion medium. By way of illustration, the immersion medium stabilizing component 120 can receive information associated with the immersion medium via the input component 110 and can identify the existence of instability within the immersion medium. For example, the immersion medium stabilizing component 120 can generate a gradient map (e.g., temperature gradient map, density gradient map, pressure gradient map, . . . ) that facilitates understanding the immersion medium stability. Additionally and/or alternatively, the immersion medium stabilizing component 120 can yield a control signal that can be employed in connection with minimizing a current amount of turbulence that is present within the immersion medium. The immersion medium stabilizing component 120 can be a computer controlled component utilized to monitor properties associated with the immersion medium during scanner/stepper exposure and reduce an effect of flow due to the immersion medium gradient (e.g., temperature gradient). According to an example, flow can result from temperature differences either within the immersion medium and/or between the immersion medium and its boundary. The flow can be mitigated via utilizing the immersion medium stabilizing component 120, which can evaluate the temperature gradient and provide control signals that can be employed to mitigate and/or eliminate the temperature differences and/or the deleterious results of immersion medium flow.

The immersion medium stabilizing component 120 can provide an output, such as a control signal, to the output component 130. The output component 130 can utilize the control signal to effectuate changing current properties associated with the lithographic system (e.g., immersion medium properties, scanner/stepper properties, . . . ). For example, the output component 130 can employ the output from the immersion medium stabilizing component 120 to stop and/or alter scanner/stepper exposure, facilitate heating and/or cooling of the immersion medium or a portion of the immersion medium, effectuate flushing the immersion medium, degas the immersion medium, vary movement of components associated with semiconductor fabrication (e.g., wafer stage movement, . . . ), control other components and/or processes associated with semiconductor fabrication, etc.

According to an aspect of the subject invention, the immersion medium occupies a gap between a substrate (not shown) and a final optical component (not shown) utilized in connection with photolithographic processing (e.g., lens, stepper, scanner, . . . ). The subject invention contemplates the use of any amount of immersion medium. For example, the immersion medium can be a thin liquid film between the substrate and the final optical component, an entire wafer can be immersed within the immersion medium, a drop or a plurality of drops of the immersion medium can be employed, etc. An entire surface of a wafer or a portion of the surface can be in contact with the immersion medium. Characteristics of the immersion medium can include low optical absorption at the exposure radiation wavelength, compatibility with resist and lens material, uniformity of properties throughout the immersion medium, non-contaminating, etc. According to an aspect of the subject invention, the immersion medium can be, for example, water, oil (e.g., perfluorinated polyethers (PFPE) including PFPE-K, PFPE-Y, PFPE-D, PFPE-M, PFPE-Z), etc. The immersion medium utilized in connection with the subject invention typically has a refractive index greater than the refractive index of air. For example, the refractive index corresponding to about 193 nm radiation is approximately 1.4 for water and approximately 1 for air. Furthermore, it is desirable to utilize an immersion medium that is about 100% transparent to an exposure radiation wavelength, although the subject invention is not so limited.

Figure 2:
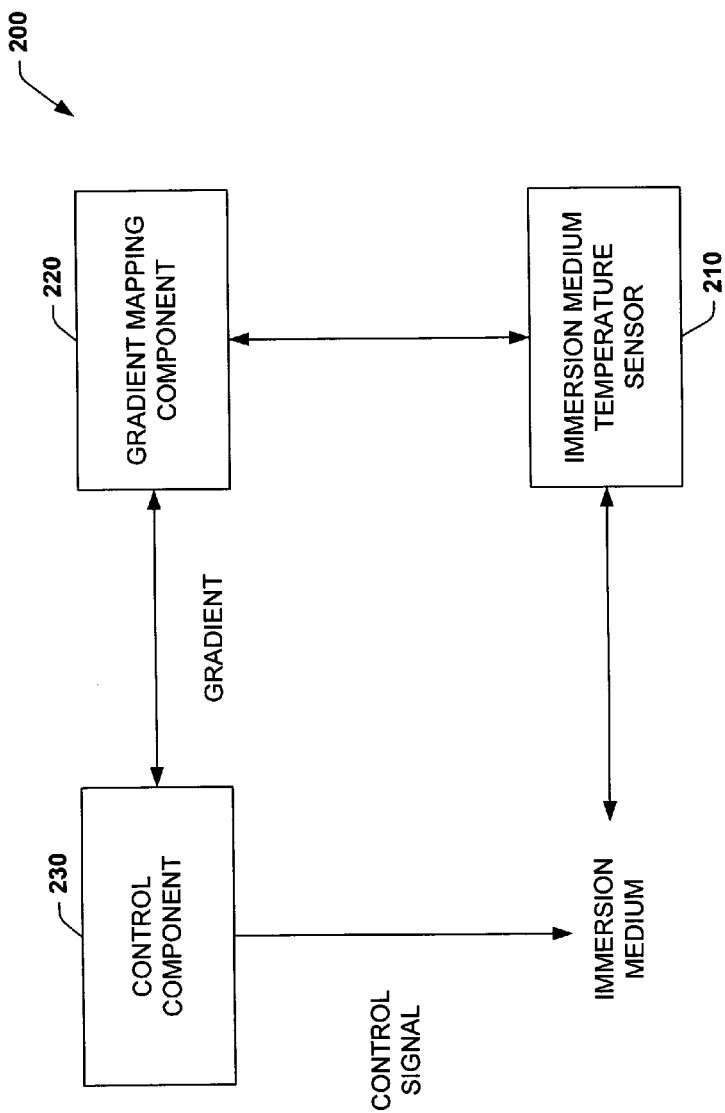
FIG. 2 is an illustration of a system that monitors and/or controls turbulence of an immersion medium by generating a temperature gradient map in accordance with an aspect of the subject invention.

Turning to FIG. 2, illustrated is a system 200 that monitors and/or controls turbulence within an immersion medium according to an aspect of the subject invention. The system 200 comprises an immersion medium temperature sensor 210, a gradient mapping component 220, and a control component 230. The immersion medium temperature sensor 210 (e.g., input component 110) can be any device operable to measure a temperature of the immersion medium or a portion of the immersion medium. Furthermore, the subject invention contemplates the use of any number of immersion medium temperature sensors 210. According to an aspect, the immersion medium temperature sensor 210 can measure additional properties associated with the immersion medium such as, for example, pressure, density, fluid dynamics, etc.

The immersion medium temperature sensor 210 can utilize contact and/or noncontact temperature measurement techniques. Additionally, the immersion medium temperature sensor 210 can be an analog and/or a digital device, or a device that converts from an analog signal to a digital signal (or vice versa). Furthermore, the immersion medium temperature sensor 210 can be a thermocouple, a resistive temperature device (RTD), a thermistor, an infrared radiator, a bimetallic device, a liquid expansion device, a change of state device, etc.

By way of illustration, the immersion medium temperature sensor 210 can be an infrared temperature sensor that employs a noncontact temperature measurement technique. The infrared temperature sensor can absorb ambient infrared radiation emitted from the immersion medium surface. The received electromagnetic information can be converted to an electrical signal related to the temperature; thus, the infrared temperature sensor(s) can be positioned at a distance and at various angles from the immersion medium while monitoring the temperature(s). Alternatively or additionally, the immersion medium temperature sensor 210 can be a thermocouple that includes multiple wires (e.g., two wires), where each is a disparate material. The two wires can be connected at one end to form a measuring junction, which is the location where a temperature measurement of the immersion medium is taken. The two wires additionally can form a reference junction at a measuring instrument. Temperature differences between the measuring junction and the reference junction yield a current flow that can be evaluated to determine the temperature. The immersion medium temperature sensor 210 can also be a thermistor that utilizes a metal oxide ceramic base element, which typically exhibits a large change (e.g., linear or non-linear) in resistance proportional to a small change in temperature. Two thermistor elements can be employed in combination to reduce non-linear temperature responses. According to an aspect, the immersion medium temperature sensor 210 can be a fiber optic temperature sensor that typically includes a thin film formed of gallium arsenide on the end of the fiber. The temperature is determined via the fiber optic sensor by evaluating the reflected absorption/transmission spectrum. The subject invention, however, is not limited to the aforementioned exemplary devices and/or techniques that can be utilized as the immersion medium temperature sensor 210.

The information obtained via the immersion medium temperature sensor 210 is provided to the gradient mapping component 220. The gradient mapping component 220 utilizes the obtained information to generate a temperature gradient of the immersion medium that includes temperature values from N locations of the immersion medium, N being an integer greater than zero. The gradient mapping component 220 can determine the temperature value at a particular location by utilizing a measured value obtained with the immersion medium temperature sensor 210. Alternatively or additionally, a temperature value at a particular location can be identified by utilizing a statistical and/or probabilistic analysis. For example, an interpolation or extrapolation technique can be used to determine a temperature value at a position lacking a temperature measurement made with the immersion medium temperature sensor 210. The gradient mapping component 220 can yield a one-dimensional, two-dimensional, three-dimensional gradient, . . . , x-dimensional gradient, where x is an integer greater than zero.

The gradient mapping component 220 is coupled to the control component 230 that can facilitate changing current specifications associated with the immersion medium and/or a semiconductor fabrication process. The gradient mapping component 220 provides the control component 230 with a gradient that represents the temperature values of the immersion medium at various locations. From the received gradient, the control component 230 can identify immersion medium instability and mitigate the effect of liquid flow caused by temperature differences between disparate regions of the immersion medium. The control component 230 can provide a control signal that is utilized to reduce the temperature differences. By way of illustration, the control component 230 can send a control signal to a stepper/scanner that stops and/or changes a semiconductor fabrication process. The control component 230 can also transmit a control signal to a device such as a value, pump, drain, etc. that can change states (e.g., signal utilized to open drain, start pump, . . . ) to facilitate removing the immersion medium.

According to another example, the control component 230 can produce a control signal that effectuates heating and/or cooling of the immersion medium. The heating and/or cooling can be selective, such that a portion of the immersion medium undergoes a temperature change while the remainder of the immersion medium remains at substantially the same temperature. Alternatively, the entire immersion medium can be heated and/or cooled. According to another example, the control component 230 can send a control signal to a device that is operable to degas the immersion medium and remove bubbles existent within the immersion medium (e.g., the bubbles can be caused by immersion medium flow caused by instability in the immersion medium). The subject invention, however, is not limited to the aforementioned uses of the control signal provided by the control component 230 to mitigate and/or eliminate immersion medium instability and/or flow.

Figure 3:
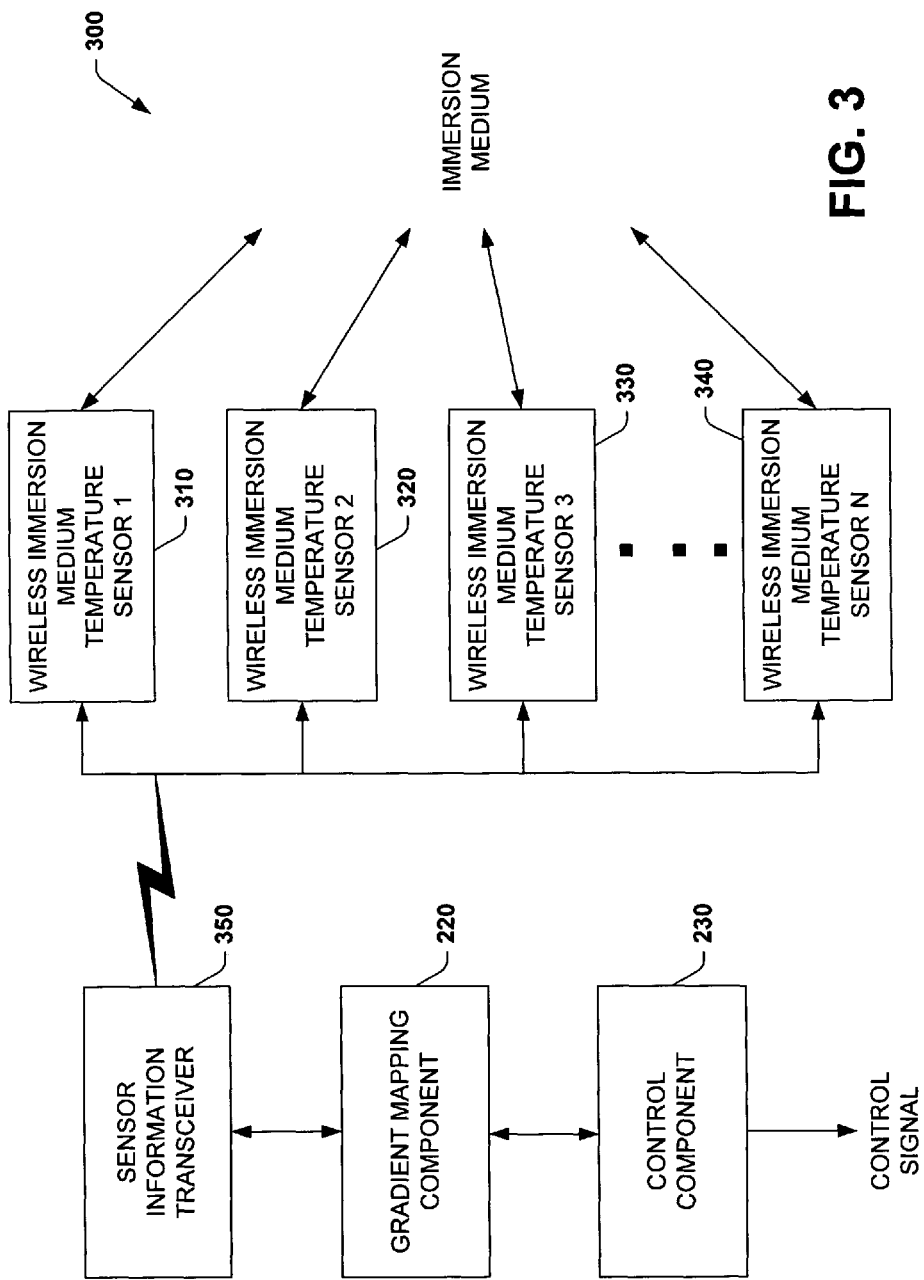
FIG. 3 is an illustration of a system that minimizes immersion medium turbulence utilizing a plurality of wireless immersion medium temperature sensors in accordance with an aspect of the subject invention.

With reference to FIG. 3, illustrated is a system 300 that minimizes immersion medium turbulence in accordance with an aspect of the subject invention. The system 300 includes N wireless immersion medium temperature sensors 310-340, wherein N is an integer greater than or equal to one. The wireless immersion medium temperature sensors 310-340 measure a temperature of the immersion medium associated with the respective location of the sensor. Additionally, the immersion medium temperature sensors 310-340 can measure other properties associated with the immersion medium such as, for example, pressure, fluid flow, etc. The wireless immersion medium temperature sensors 310-340 wirelessly transmit the measured information to a sensor information transceiver 350, which is coupled to the gradient mapping component 220 to generate a temperature gradient associated with the immersion medium. Furthermore, the gradient mapping component 220 is coupled to the control component 230, which monitors the immersion medium via the temperature gradient and yields a control signal that can be utilized to mitigate and/or eliminate turbulence existent within the immersion medium.

The subject invention contemplates positioning the wireless immersion medium temperature sensors 310-340 at any location and angle. For example, the wireless immersion medium temperature sensors 310-340 can be positioned on a wafer, embedded in a wafer, affixed to a wall of a chamber containing the immersion medium, attached at a distance from the immersion medium, a combination thereof, etc. The wireless immersion medium temperature sensors 310-340 can be in a fixed position and/or can be mobile. Furthermore, the wireless immersion medium temperature sensors 310-340 can be positioned at any location with respect to one another (e.g., sensors can be positioned in one line, one plane, multiple planes, . . . ).

The sensor information transceiver 350 can transmit and/or receive information from the wireless immersion medium temperature sensors 310-340. According to an aspect, the wireless immersion medium temperature sensors 310-340 can measure a temperature at each respective position and transmit the temperature information wirelessly to the sensor information transceiver 350 that can be located at a position that is remote from the sensors. The communications can utilize radio frequency, optics and/or infrared waves to transmit information between the wireless immersion medium temperature sensors 310-340 and the sensor information transceiver 350. Any wireless communications technique and/or protocol can be employed in connection with the subject invention (e.g., Bluetooth, GSM, PCS, CDMA, TDMA, encryption techniques, error reduction techniques, . . . ).

According to an aspect, the wireless immersion medium temperature sensors 310-340 can be calibrated to reduce temperature gradient errors introduced by variations associated with disparate wireless immersion medium temperature sensors 310-340. For example, the wireless immersion medium temperature sensors 310-340 can be self-calibrating, calibrated via a signal provided by the sensor information transceiver 350, and/or with a signal yielded by another of the wireless immersion medium temperature sensors 310-340.

Figure 4:
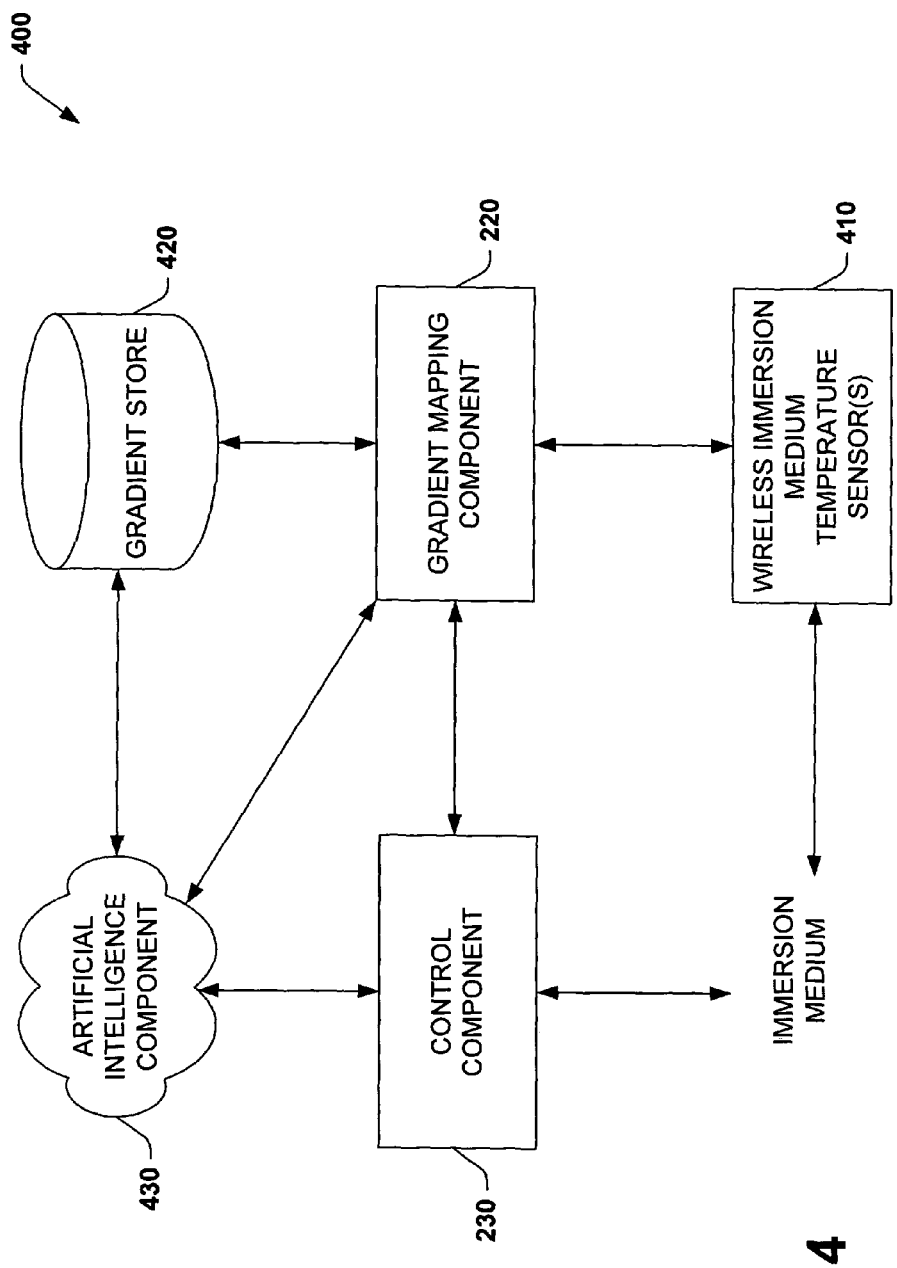
FIG. 4 is an illustration of a system that monitors and/or controls immersion medium turbulence utilizing artificial intelligence in accordance with an aspect of the subject invention.

FIG. 4 illustrates a system 400 that monitors and/or controls immersion medium stability in accordance with an aspect of the subject invention. The system 400 includes wireless immersion medium temperature sensors 410 (e.g., wireless immersion medium temperature sensors 310-340) that are coupled to the gradient mapping component 220. For example, gradient mapping component 220 can include a wireless transceiver (not shown) that can communicate with the sensors 410. Alternatively, a separate component can be utilized to communicate with the sensors 410 (e.g., sensor information transceiver 350, wireless access point, . . . ). The gradient mapping component 220 is also coupled to a gradient store 420 and the control component 230. The control component 230 is further coupled to an artificial intelligence component 430.

The gradient mapping component 220 generates gradient maps corresponding to an immersion medium to understand its stability. The gradient mapping component 220 can store generated gradient maps in the gradient store 420. Additionally and/or alternatively, the gradient mapping component 220 can retrieve stored gradient maps from the gradient store 420 and thereby utilize the stored gradient maps or a portion thereof to facilitate generating a gradient map associated with the current immersion medium conditions. The gradient store 420 can be either volatile memory or nonvolatile memory, or can comprise both volatile and nonvolatile memory. By way of illustration, and not limitation, nonvolatile memory can comprise read only memory (ROM), programmable ROM (PROM), electrically programmable ROM (EPROM), electrically erasable programmable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The memory of the present systems and methods is intended to comprise, without being limited to, these and any other suitable types of memory.

The artificial intelligence component 430 is coupled to the control component 230. The artificial intelligence component 430 can perform inferences regarding immersion medium stability in accordance with an aspect of the subject invention. For example, the artificial intelligence component 430 can be utilized to determine whether immersion medium flow exists under the present conditions by analyzing the gradient map provided to the control component 230 via the gradient mapping component 220. Furthermore, the artificial intelligence component 430 can utilize the information stored in the gradient store 420 to determine whether turbulence exists within the immersion medium. Additionally, the artificial intelligence component 430 can be operatively coupled to the gradient mapping component 220 to infer temperature values at various locations corresponding to input obtained by the wireless immersion medium temperature sensor(s) 410; thus, such inferences facilitate generating the gradient maps. The artificial intelligence component 430 can also determine a technique to employ to reduce immersion medium instability. Thus, the artificial intelligence component 430 can identify a device to which the control component 230 could provide a control signal to mitigate and/or eliminate instability.

Figure 5:
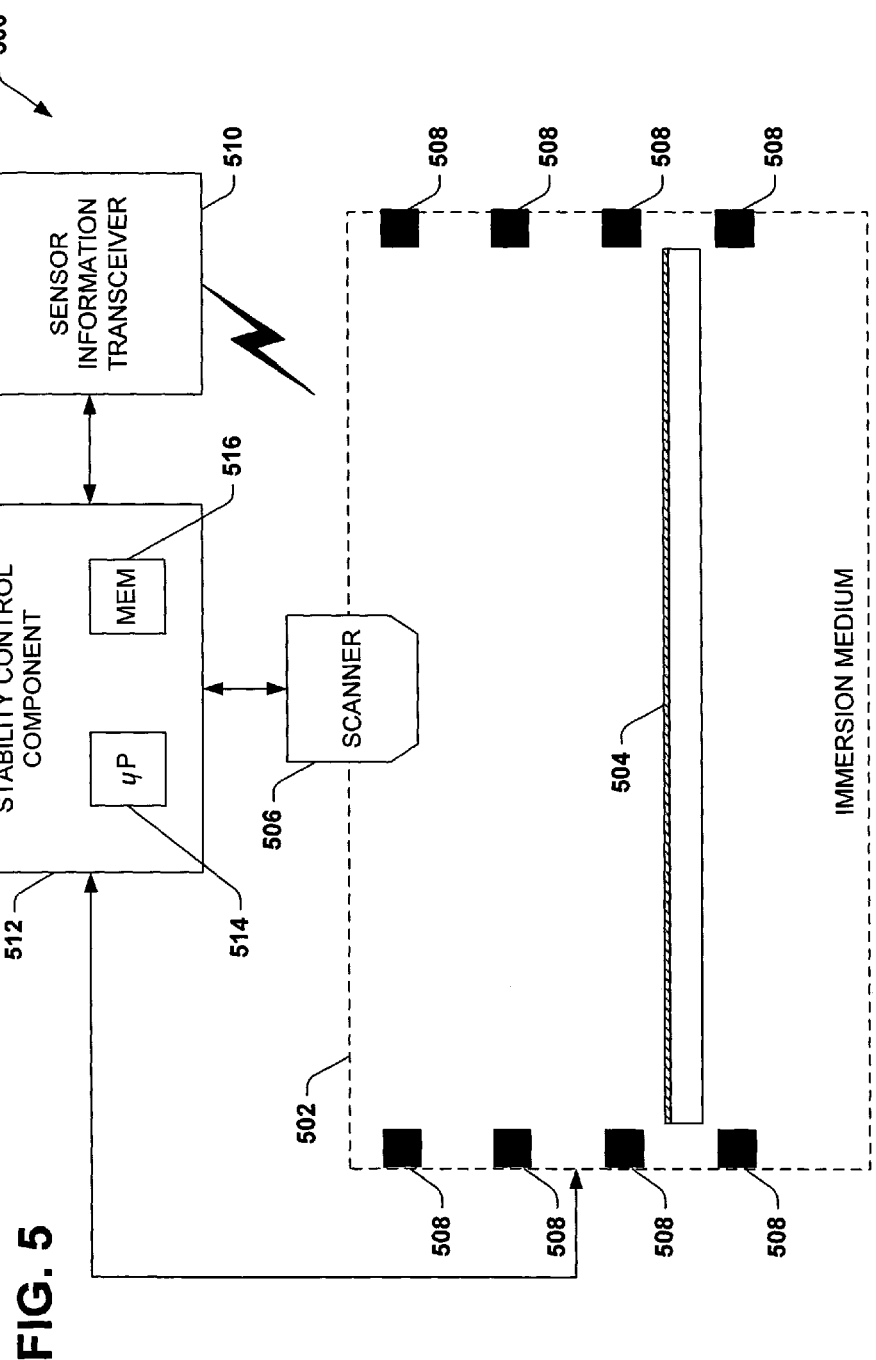
FIG. 5 is a schematic block diagram of an exemplary immersion medium stability monitoring and/or controlling system in accordance with an aspect of the subject invention.

FIG. 5 illustrates an example of a system 500 that monitors and/or controls instability of an immersion medium 502 in accordance with an aspect of the subject invention. In this example, a substrate 504 (e.g., wafer, wafer stage, reticle, wafer with photoresist layered upon it, . . . ) is at least partially within an immersion medium 402 (e.g., water, supercritical fluid in gaseous state, ozone vapor, oil, . . . ). Additionally, a final optical component, such as a scanner 506 (e.g., lens, . . . ), is also at least partially within the immersion medium 506. The system 500 further comprises wireless temperature sensors 508 that measure temperature of the immersion medium 502 at various locations. FIG. 5 depicts eight wireless sensors 508, however, the subject invention contemplates the use of any number of wireless sensors 508. Additionally, the invention is not limited to the illustrated positioning of the wireless temperature sensors 508 with respect to each other and the substrate 504. Furthermore, the wireless temperature sensors 508 can be located outside of the immersion medium 502 and can be operable to employ non-contact temperature measurement techniques.

The wireless temperature sensors 508 transmit and receive information from a sensor information transceiver 510 (e.g., sensor information transceiver 350) that is coupled to a stability control component 512. The stability control component 512 comprises a processor 514 and memory 516. It is to be understood that the processor 514 can be a processor dedicated to determining a temperature gradient of an immersion medium 502, a processor that monitors temperature differences within an immersion medium 502, a process that detects flow within the immersion medium 502, a processor used to control the immersion medium 502 thereby reducing an amount of turbulence and/or instability, or, alternatively, a combination thereof.

The memory 516 stores program code executed by the processor 514 for carrying out operating functions of the system. The memory 516 also serves as a storage medium for temporarily storing information, such as temperature at a particular location, pressure at a particular location, gradient map, etc. that can be employed in carrying out the present invention. The memory 516 can be either volatile memory or nonvolatile memory, or can comprise both volatile and nonvolatile memory. By way of illustration, and not limitation, nonvolatile memory can comprise read only memory (ROM), programmable ROM (PROM), electrically programmable ROM (EPROM), electrically erasable programmable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The memory of the present systems and methods is intended to comprise, without being limited to, these and any other suitable types of memory.

The stability control component 512 is additionally coupled to the immersion medium 502 and the scanner 506. The stability control component 512 can effectuate changes upon current conditions of the immersion medium 502. Thus, by way of illustration, if instability is identified by the stability control component 512, a signal can be provided to the scanner 506 to stop and/or alter a semiconductor fabrication process. Additionally or alternatively, the stability control component 512 can provide a signal that effectuates flushing and/or degassing of the immersion medium 502. By way of further illustration, the stability control component 512 can cause heating and/or cooling of the immersion medium 502 to reduce temperature differences. The aforementioned examples are provided for illustration and the subject invention is not so limited.

Turning to FIG. 6, in accordance with one or more aspects of the present invention, a wafer 602 situated on a stage 604 can be logically partitioned into grid blocks. Each grid block (XY) of the grid pattern corresponds to a particular portion of the wafer 602. The grid blocks are utilized to denote regions of an immersion medium that occupy a gap between an optical element (e.g., lens) and the wafer 602. The subject invention, however, is not limited to a two-dimensional evaluation of the immersion medium temperature.

By way of further example, FIG. 7 illustrates a three-dimensional representation of a temperature profile for the immersion medium at a given instant in time. While in FIG. 7, the immersion medium has been mapped (partitioned) into 144 grid block portions, the immersion medium could be mapped with any suitable number of zones and/or into other coordinate systems (e.g., three-dimensional evaluation of immersion medium temperature, . . . ). The temperature amplitudes of each zone of the immersion medium are shown. In FIG. 7, each respective zone of the immersion medium ($X_1$, $Y_1$ . . . $X_{12}$, $Y_{12}$) has a temperature, which was sensed by a temperature sensor (e.g., wireless temperature sensor) associated with each respective zone. Alternatively, temperature data for the temperature sensors can be analyzed and the temperature for each of the predetermined zones can be extrapolated (e.g., by statistical analysis of the temperature data). Alternatively, one or more noncontact temperature sensors can sense temperature characteristics of the immersion medium and map the temperature characteristics to respective zones of the immersion medium, which can be stored in memory as temperature data.

The temperature data further can be evaluated over time to predict trends associated with immersion medium stability. As can be seen from FIG. 7, the temperature of the immersion medium at coordinates $X_7, Y_6$ and $X_7, Y_{10}$ are substantially higher than the temperature of the other immersion medium zones; thus, immersion medium instability can result in immersion medium flow, which can reduce photolithographic efficiency and yield. Temperature information similar to that shown in FIG. 7 can be collected and stored as historical temperature data for the immersion medium as a function of time. The historical temperature data can be stored for the current exposure cycle as well as one or more recent other exposure cycles for the substrate. The historical database provides useful temperature information based on which process parameters, including exposure time, can be adjusted so as to inhibit differences in immersion medium temperature that can result in instability.

FIG. 8 is a representative table of temperature amplitudes (taken at the various grid blocks). The temperature amplitude values have been correlated with acceptable temperature amplitude values for the portions of the immersion medium mapped by the respective zones. Alternatively, the temperature amplitude values can be correlated with a mean and/or median temperature value to identify portion(s) of the immersion medium that vary greatly from the other portions of the immersion medium. The table, for example, could be derived based on comparing a temperature condition associated with each zone relative to a temperature condition threshold, which can be derived based on the current and/or previous exposure cycles. For example, if $Temp_{x,y} > Temp_{threshold}$, then the temperature condition for that zone can be labeled as unacceptable $T_U$. If $Temp_{x,y} \leq Temp_{threshold}$, then the temperature for that zone can be labeled as acceptable $T_A$. Alternatively, an average temperature can be derived for each zone, such as based on a comparison of temperature values for each respective zone. The zones determined as having temperature conditions that increase (or decrease) at a rate that exceeds a predetermined threshold further can be labeled as unacceptable $T_U$. A determined rate of temperature change (e.g., increase or decrease) also can be used in conjunction with the determined zone temperature to determine whether the temperature condition for each zone is acceptable or unacceptable. The control component 230 (FIG. 2) thus can employ the temperature condition information (e.g., temperature gradient) to control the immersion medium; thus, the control component 230 can reduce the effect of flow due to an immersion medium temperature gradient.

As can be seen in FIG. 8, all of the grid blocks except grid blocks $X_7 Y_6$ and $X_7, Y_{10}$ have temperature conditions corresponding to acceptable temperature conditions ($T_A$) (e.g., are within an expected range, vary less than a threshold amount from a mean and/or median value, . . . ), while grid blocks $X_7 Y_6$ and $X_7, Y_{10}$ have undesired temperature conditions ($T_U$). Thus, the control component 230 has determined that an undesirable temperature condition exists (or is likely to exist at a time in the near future) at the portion of the immersion medium mapped by grid blocks $X_7 Y_6$ and $X_7, Y_{10}$. Additionally, the control component 230 can yield a control signal to mitigate the deleterious consequences associated with immersion medium instability as noted supra.

Figure 9:
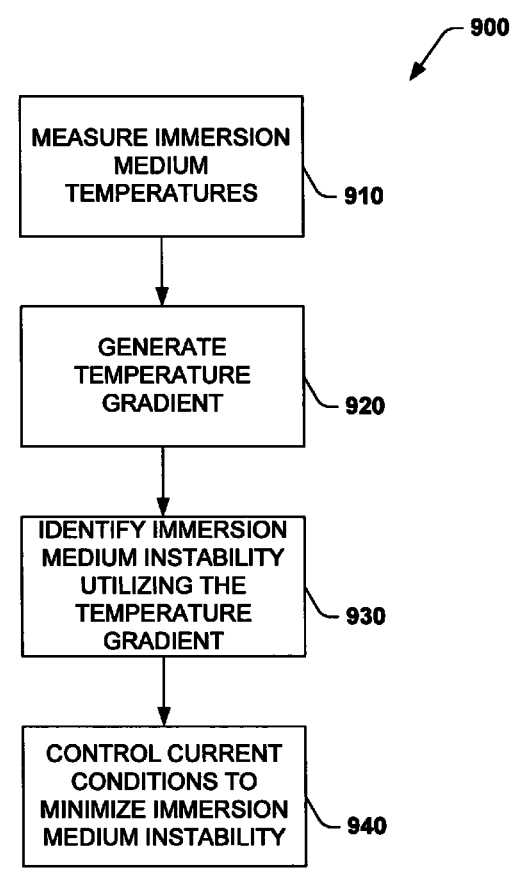
FIG. 9 is a flow diagram of an immersion medium stability monitoring and/or controlling methodology in accordance with an aspect of the subject invention.
Figure 10:
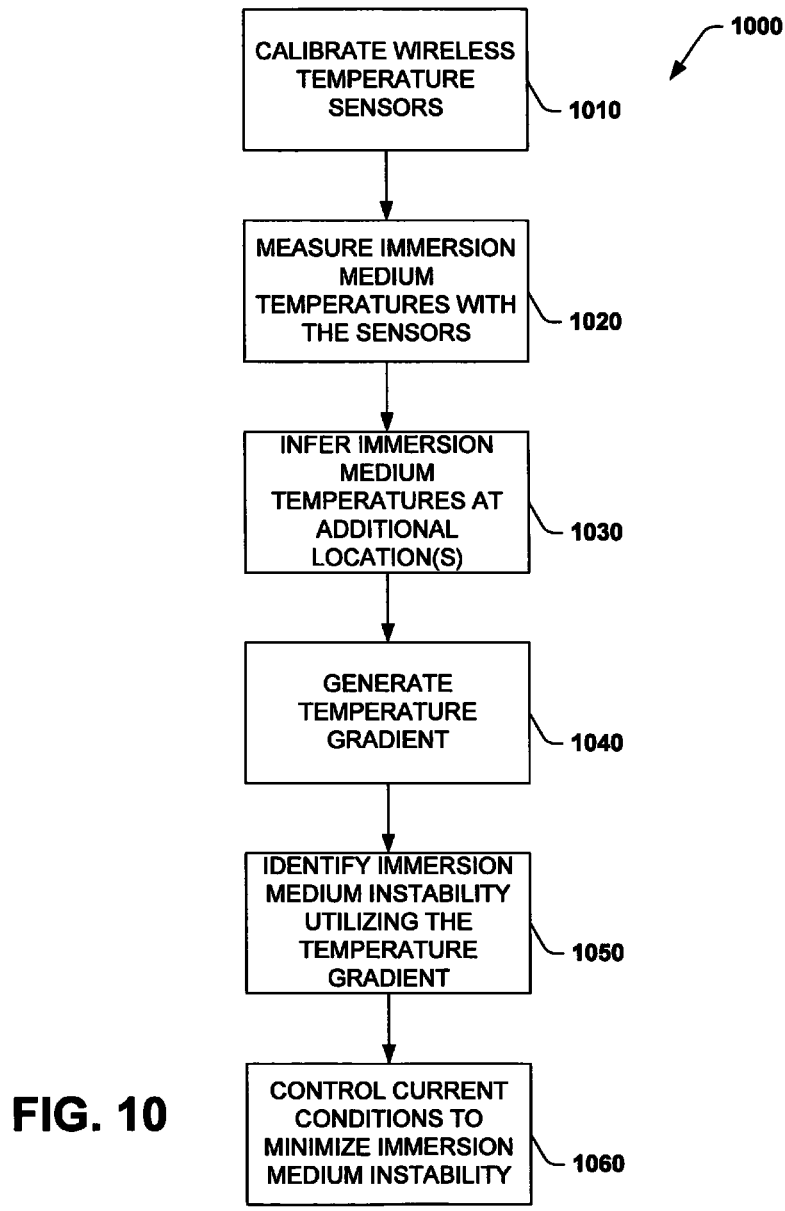
FIG. 10 is a flow diagram of an immersion medium stability monitoring and/or controlling methodology that infers temperature gradient values in accordance with an aspect of the subject invention.

In view of the exemplary systems shown and described above, methodologies 900 and 1000, which may be implemented in accordance with the subject invention, will be better appreciated with reference to the flow diagrams of FIG. 9 and FIG. 10. While, for purposes of simplicity of explanation, the methodologies 900 and 1000 are shown and described as a series of function blocks, it is to be understood and appreciated that the subject invention is not limited by the order of the blocks, as some blocks may, in accordance with the subject invention, occur in different orders and/or concurrently with other blocks from that shown and described herein. Moreover, not all illustrated blocks may be required to implement the methodologies 900 and 1000 in accordance with the subject invention. It is to be appreciated that the various blocks may be implemented via software, hardware a combination thereof or any suitable means (e.g., device, system, process, component) for carrying out the functionality associated with the blocks. It is also to be appreciated that the blocks are merely to illustrate certain aspects of the subject invention in a simplified form and that these aspects may be illustrated via a lesser and/or greater number of blocks.

Turning to FIG. 9, illustrated is a methodology 900 for monitoring and/or controlling immersion medium stability in accordance with an aspect of the subject invention. At 910, the immersion medium temperature is measured at various locations of the immersion medium. Such measurements can be obtained utilizing one or more wireless temperature sensors. Additionally or alternatively, other measurements related to the immersion medium can be conducted (e.g., pressure, fluid flow, . . . ). At 920, the measurements obtained are employed to generate a temperature gradient of the immersion medium. The temperature gradient can be mapped and can include any number of dimensions (e.g., one-dimensional line, two-dimensional plane, three-dimensional multi-plane, . . . ). Thus, the temperature gradient map size generated is associated with the locations from which the temperature measurements were taken. Immersion medium instability is identified at 930 by utilizing the temperature gradient. By way of example, differences in temperature between regions of the immersion medium can indicate the existence of flow between regions; thus, such indicators of immersion medium flow are identified. At 940, current conditions of the immersion medium are controlled to minimize immersion medium instability. For example, if turbulence is identified, the instability can be controlled by selectively heating a portion and/or the entire immersion medium, flushing the immersion medium, degassing the immersion medium, stopping and/or altering a semiconductor fabrication process, etc.

With reference to FIG. 10, depicted is a methodology 1000 for controlling and/or monitoring immersion medium turbulence and/or instability according to an aspect of the subject invention. At 1010, wireless temperature sensors are calibrated (e.g., via self-calibration, signal sent from an access point, signal transmitted from another wireless temperature sensor). The subject invention contemplates the use of any type of wireless temperature sensor (e.g., a thermocouple, a resistive temperature device (RTD), a thermistor, an infrared radiator, a bimetallic device, a liquid expansion device, a change of state device, . . . ). At 1020, immersion medium temperature(s) are measured utilizing the wireless immersion medium temperature sensors. The wireless immersion medium temperature sensors can be located in, adjacent to, or at a distance and/or angle from the immersion medium. By way of illustration, a plurality of wireless immersion medium temperature sensors can be utilized, and each sensor can measure the temperature of a particular portion of the immersion medium.

At 1030, immersion medium temperature(s) are inferred for additional location(s). For example, for different time segments, a wireless immersion medium temperature sensor can measure temperatures associated with disparate portions of the immersion medium. Thus, temperatures associated with the portions not measured can be inferred (e.g., via analyzing historical data, interpolation, probabilistic analysis, . . . ). Alternatively, for disparate time segments, less than all of the wireless immersion medium temperature sensors are utilized, and the temperatures associated with immersion medium locations with the sensors that are not used can be inferred. Additionally, portions of the immersion medium that are not subject to direct measurement via a temperature sensor can have a temperature associated with each respective portion inferred.

At 1040, the obtained temperature information is utilized to generate a temperature gradient. At 1050, the temperature gradient is evaluated to identify immersion medium instability. Thus, regions of the immersion medium with temperatures that vary from an average and/or median temperature can indicate instability. At 1060, immersion medium instability is mitigated via controlling the current conditions of the immersion medium (e.g., temperature, pressure, operation of semiconductor fabrication devices, . . . ) thereby reducing and/or eliminating the deleterious impact of immersion medium flow.

Figure 11:
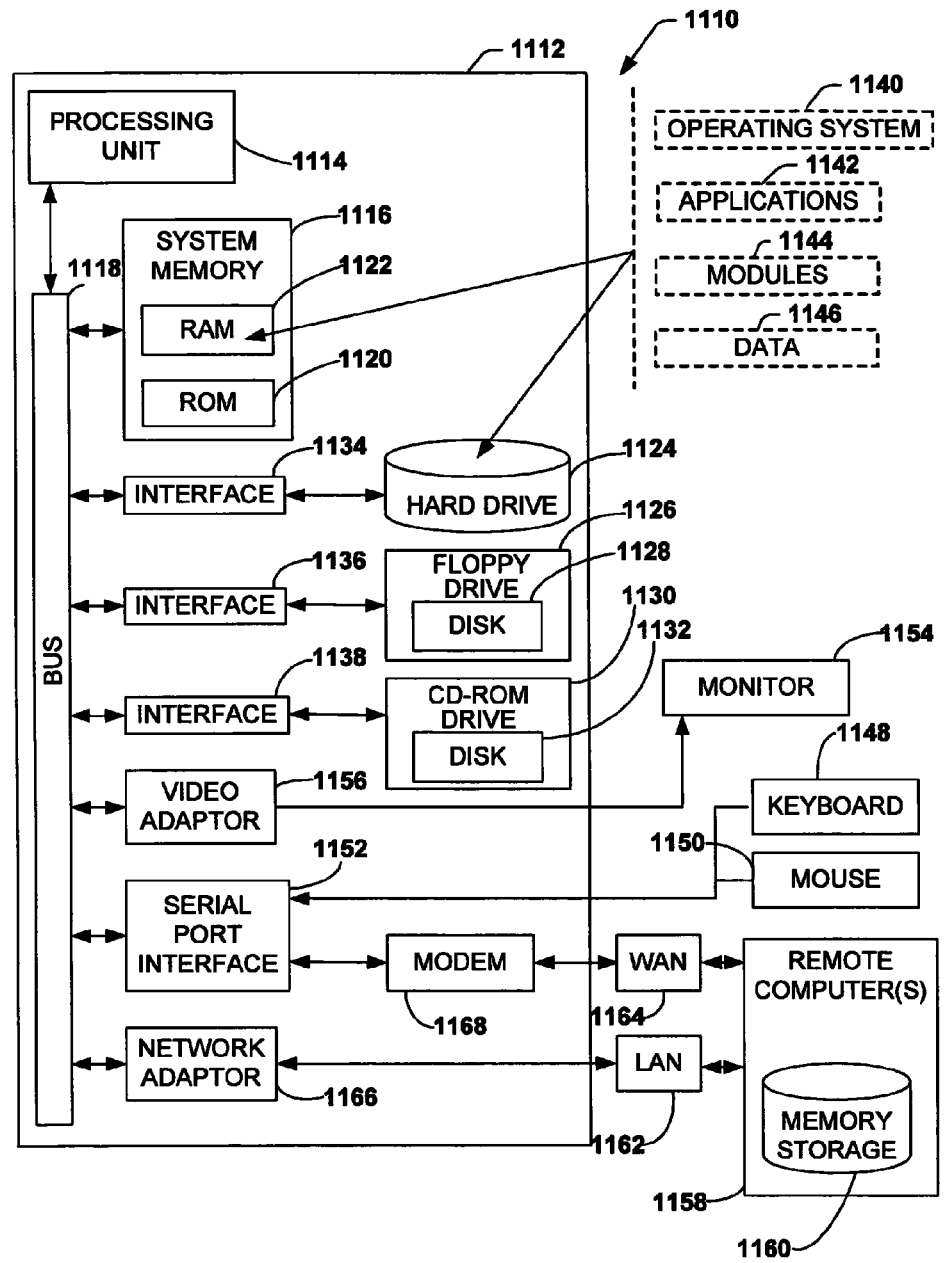
FIG. 11 is an illustration of an exemplary computing system and/or environment in connection with facilitating employment of the subject invention.

In order to provide additional context for various aspects of the subject invention, FIG. 11 and the following discussion are intended to provide a brief, general description of a suitable computing environment 1110 in which the various aspects of the subject invention can be implemented. While the invention has been described above in the general context of computer-executable instructions that may run on one or more computers, those skilled in the art will recognize that the invention also may be implemented in combination with other program modules and/or as a combination of hardware and software. Generally, program modules include routines, programs, components, data structures, etc. that perform particular tasks or implement particular abstract data types. Moreover, those skilled in the art will appreciate that the inventive methods may be practiced with other computer system configurations, including single-processor or multi-processor computer systems, minicomputers, mainframe computers, as well as personal computers, hand-held computing devices, microprocessor-based or programmable consumer electronics, and the like, each of which may be operatively coupled to one or more associated devices. The illustrated aspects of the invention may also be practiced in distributed computing environments where certain tasks are performed by remote processing devices that are linked through a communications network. In a distributed computing environment, program modules may be located in both local and remote memory storage devices.

With reference to FIG. 11, an exemplary environment 1110 for implementing various aspects of the invention includes a computer 1112, including a processing unit 1114, a system memory 1116, and a system bus 1118 that couples various system components including the system memory to the processing unit 1114. The processing unit 1114 may be any of various commercially available processors. Dual microprocessors and other multi-processor architectures also can be used as the processing unit 1114.

The system bus 1118 can be any of several types of bus structure including a memory bus or memory controller, a peripheral bus, and a local bus using any of a variety of conventional bus architectures such as PCI, VESA, Microchannel, ISA, and EISA, to name a few. The system memory 1116 includes read only memory (ROM) 1120 and random access memory (RAM) 1122. A basic input/output system (BIOS), containing the basic routines that help to transfer information between elements within the computer 1112, such as during start-up, is stored in ROM 1120.

The computer 1112 further includes a hard disk drive 1124, a magnetic disk drive 1126 to read from or write to, for example, a removable disk 1128, and an optical disk drive 1130 for reading, for example, from a CD-ROM disk 1132 or to read from or write to other optical media. The hard disk drive 1124, magnetic disk drive 1126, and optical disk drive 1130 are connected to the system bus 1118 by a hard disk drive interface 1134, a magnetic disk drive interface 1136, and an optical drive interface 1138, respectively. The drives and their associated computer-readable media provide non-volatile storage of data, data structures, computer-executable instructions, etc. for the computer 1112, including for the storage of broadcast programming in a suitable digital format. Although the description of computer-readable media above refers to a hard disk, a removable magnetic disk and a CD, it should be appreciated by those skilled in the art that other types of media which are readable by a computer, such as magnetic cassettes, flash memory cards, digital video disks, Bernoulli cartridges, and the like, may also be used in the exemplary operating environment, and further that any such media may contain computer-executable instructions for performing the methods of the subject invention.

A number of program modules may be stored in the drives and RAM 1122, including an operating system 1140, one or more application programs 1142, other program modules 1144, and program data 1146. The operating system 1140 in the illustrated computer is, for example, the "Microsoft® Windows® NT" operating system, although it is to be appreciated that the subject invention may be implemented with other operating systems or combinations of operating systems, such as UNIX®, LINUX®, etc.

A user may enter commands and information into the computer 1112 through a keyboard 1148 and a pointing device, such as a mouse 1150. Other input devices (not shown) may include a microphone, an IR remote control, a joystick, a game pad, a satellite dish, a scanner, or the like. These and other input devices are often connected to the processing unit 1114 through a serial port interface 1152 that is coupled to the system bus 1118, but may be connected by other interfaces, such as a parallel port, a game port, a universal serial bus ("USB"), an IR interface, etc. A monitor 1154 or other type of display device is also connected to the system bus 1118 via an interface, such as a video adapter 1156. In addition to the monitor, a computer typically includes other peripheral output devices (not shown), such as speakers, printers etc.

The computer 1112 may operate in a networked environment using logical connections to one or more remote computers, such as a remote computer(s) 1158. The remote computer(s) 1158 may be a workstation, a server computer, a router, a personal computer, microprocessor based entertainment appliance (e.g., a WEBTV® client system), a peer device or other common network node, and typically includes many or all of the elements described relative to the computer 1112, although, for purposes of brevity, only a memory storage device 1160 is illustrated. The logical connections depicted include a local area network (LAN) 1162 and a wide area network (WAN) 1164. Such networking environments are commonplace in offices, enterprise-wide computer networks, intranets and the Internet.

When used in a LAN networking environment, the computer 1112 is connected to the local network 1162 through a network interface or adapter 1166. When used in a WAN networking environment, the computer 1112 typically includes a modem 1168, or is connected to a communications server on the LAN, or has other means for establishing communications over the WAN 1164, such as the Internet. The modem 1168, which may be internal or external, is connected to the system bus 1118 via the serial port interface 1152 to enable communications, for example, via POTS. The modem 1168 may also, in an alternative embodiment, be connected to the network adaptor 1166 to enable communications, for example, via DSL or cable. In a networked environment, program modules depicted relative to the computer 1112, or portions thereof, will be stored in the remote memory storage device 1160. It may be appreciated that the network connections shown are exemplary and other means of establishing a communications link between the computers may be used.

Described above are preferred aspects of the subject invention. It is, of course, not possible to describe every conceivable combination of components or methodologies for purposes of describing the subject invention, but one of ordinary skill in the art will recognize that many further combinations and permutations of the subject invention are possible. Accordingly, the subject invention is intended to embrace all such alterations, modifications and variations that fall within the spirit and scope of the appended claims.

The invention claimed is:

1. A system that reduces immersion medium turbulence for semiconductor fabrication, comprising:
an input component that measures a temperature associated with an immersion medium at a plurality of locations and infers a temperature for a location at which the temperature was not directly measured, the inferred temperature is utilized for generating a temperature gradient; and
a stabilizing component that generates the temperature gradient from the measured and the inferred temperatures, analyzes the temperature gradient to identify instability associated with the immersion medium, determines a technique to employ to reduce immersion instability and produces an output that is utilized to stop a semiconductor fabrication process, change the semiconductor fabrication process, flush the immersion medium, or degas the immersion medium to control semiconductor fabrication to mitigate identified instability.

2. The system of claim 1, the input component includes at least one wireless temperature sensor.

3. The system of claim 1, the input component is at least one of a thermocouple, a resistive temperature device, a thermistor, an infrared radiator, a bimetallic device, a liquid expansion device, and a change of state device.

4. The system of claim 1, the input component comprises a plurality of wireless temperature sensors that each measure the temperature associated with a respective portion of the immersion medium.

5. The system of claim 1, the stability component generates the gradient map that facilitates understanding the immersion medium instability.

6. The system of claim 1, the output is a control signal that is utilized to minimize the instability.

7. The system of claim 1, the output is utilized to at least one of heat and cool at least a portion of the immersion medium.

8. The system of claim 1, the stabilizing component identifies instability caused by temperature differences associated with disparate portions of the immersion medium.

9. A system that monitors and controls immersion medium turbulence for semiconductor fabrication, comprising:
a plurality of immersion medium temperature sensors that measure a temperature associated with a respective location of the immersion medium;
an artificial intelligence component that infers additional temperatures corresponding to locations of the immersion medium where temperature is not measured directly;
a first component that generates a gradient map by utilizing the measured and inferred temperatures obtained via the immersion medium temperature sensors and the artificial intelligence component; and
a second component that controls the immersion medium to minimize instability upon identifying turbulence by evaluating the gradient map and sending a control signal to stop a semiconductor fabrication process, change the semiconductor fabrication process, flush the immersion medium, or degas the immersion medium.

10. The system of claim 9, the immersion medium temperature sensors are wireless sensors, including at least one of optical, radio frequency and infrared wireless sensors.

11. The system of claim 10, the wireless sensors are at least one of attached to a wafer, embedded in the wafer, affixed to a wall of a chamber containing the immersion medium, attached at a distance from the immersion medium, and positioned at various angles with respect to the immersion medium.

12. The system of claim 9, the gradient map is at least one of a one-dimensional map, a two-dimensional map, and a three-dimensional map.

13. The system of claim 9, further comprising a sensor information transceiver that communicates with the plurality of immersion medium temperature sensors and provides the temperatures to the first component.

14. The system of claim 9, the turbulence is identified by the second component via temperature variations in the gradient map.

15. A method for monitoring and controlling immersion medium stability for semiconductor fabrication, comprising:
measuring a temperature of the immersion medium at a plurality of locations and inferring a temperature for a location at which the temperature was not directly measured, the inferred temperature is utilized for generating a temperature gradient; generating the temperature gradient via utilizing the measured and the inferred temperatures and
controlling turbulence of the immersion medium by monitoring the temperature gradient and sending a control signal to stop a semiconductor fabrication process, change the semiconductor fabrication process, flush the immersion medium, or degas the immersion medium to effectuate semiconductor fabrication when the turbulence is detected.

16. The method of claim 15, further comprising utilizing a plurality of wireless temperature sensors to measure the temperature at the plurality of locations.

17. The method of claim 16, further comprising calibrating the wireless temperature sensors.

18. The method of claim 17, calibrating the wireless temperature sensors via utilizing at least one of self-calibration, a signal from a wireless access point, and a signal from another wireless temperature sensor.

19. The method of claim 15, further comprising controlling the turbulence of the immersion medium.

20. The method of claim 19, controlling the turbulence via at least one of flushing the immersion medium, degassing the immersion medium, heating at least a portion of the immersion medium, cooling at least a portion of the immersion medium, stopping a semiconductor fabrication process, and altering a semiconductor fabrication process.

21. A system that monitors and controls flowing of an immersion medium, comprising:
- means for measuring temperature of an immersion medium at a plurality of locations;
- means for inferring temperature for a location at which a temperature was not directly measured;
- means for generating a temperature gradient from the measured temperatures and the inferred temperatures; and
- means for utilizing the temperature gradient to control identified immersion medium turbulence by sending a control signal to stop a semiconductor fabrication process, change the semiconductor fabrication process, flush the immersion medium, or degas the immersion medium.

* * * * *